United States Patent [19]

Chow

[11] 4,233,093
[45] Nov. 11, 1980

[54] PROCESS FOR THE MANUFACTURE OF PNP TRANSISTORS HIGH POWER

[76] Inventor: Pel Chow, Jefferson Square Apts.-12A, 13000 NW. Cornell Rd., Portland, Oreg. 97229

[21] Appl. No.: 29,269

[22] Filed: Apr. 12, 1979

[51] Int. Cl.³ .......................................... H01L 21/225
[52] U.S. Cl. .................................... 148/189; 148/186; 148/187; 148/188
[58] Field of Search ........................ 148/189, 188, 187

[56] References Cited

U.S. PATENT DOCUMENTS

| | | | |
|---|---|---|---|
| 3,314,833 | 4/1967 | Arndt et al. | 148/189 |
| 3,418,181 | 12/1968 | Robinson | 148/187 |
| 3,529,347 | 9/1970 | Ingless et al. | 148/187 X |
| 3,713,913 | 1/1973 | Wolfle et al. | 148/188 X |
| 3,791,884 | 2/1974 | Dathe et al. | 148/189 X |
| 3,806,371 | 4/1974 | Barone | 148/188 X |

*Primary Examiner*—G. Ozaki
*Attorney, Agent, or Firm*—Robert G. Slick

[57] ABSTRACT

PNP high power transistors are made in high yield by a process wherein the base diffusion step is conducted in a diffusion furnace wherein phosphorus is deposited on the walls of the furnace. This results in a sharp collector to base junction.

5 Claims, 1 Drawing Figure

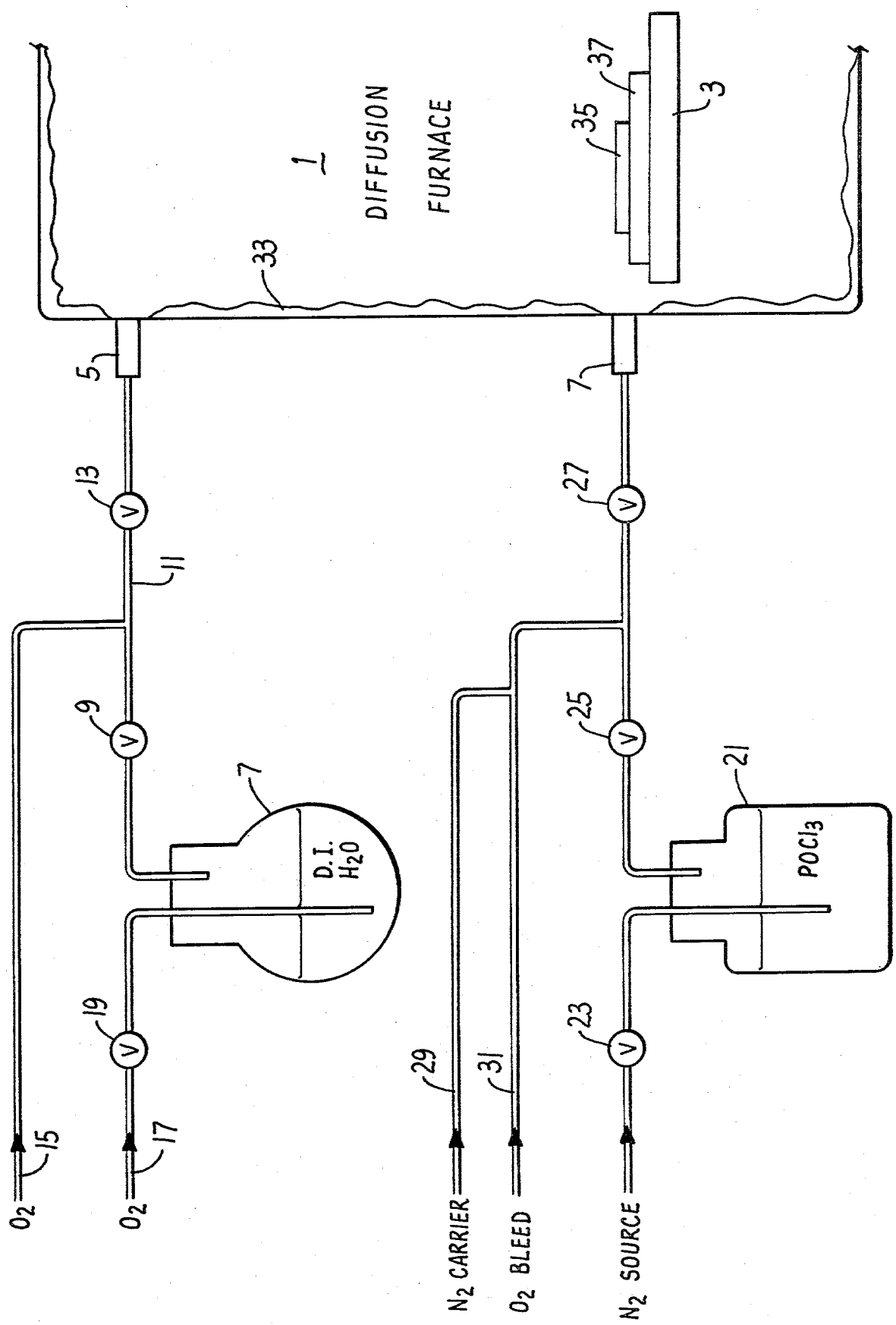

PROCESS FOR THE MANUFACTURE OF PNP TRANSISTORS HIGH POWER

SUMMARY OF THE INVENTION

In the manufacturing of semiconductor devices, the leakage current of semiconductor junctions leads to a poor quality device. This phenomenon is called softness. The elimination of soft junctions not only provides good quality devices but also leads to increased product yields and cheaper cost.

In the manufacture of high power transistors, it is relatively easy to make a NPN device but almost no complementary PNP transistors exist.

The usual problem is that CB junction leakages occur prior to and after the emitter diffusion operation. Because of this leakage, the wafer-sort yield is very low.

In accordance with the present invention, high power transistors are made in high yield utilizing a novel process. According to the invention, PNP transistors can be made in the power range of 50 to 300 watts and even higher.

The invention is particularly applicable to those transistors wherein the die size is at least 10,000 square mills and preferably on the order of 22,500 square mills and even larger. Whenever the chip size is 10,000 square mils or bigger, the leakages at the collector to base due to surface impurities, and precipitates are excessive. Consequently, a great deal of yield loss will be suffered. The process of the present invention will firstly assure a sharp CB breakdown prior to emitter diffusion. This is an essential requirement.

As is explained later in detail, the crux of the present invention consists of conducting the base diffusion step in the manufacture of a transistor in a diffusion furnace wherein the walls of the furnace have a phosphorus deposit thereon and wherein the wafers are supported on a layer of phosphorus-VAPOX ($SiO_2$) during the base diffusion step. The wafers are, of course, predoped with phosphorus to make the collector base junction so that the process can be characterized as a double P process, i.e., both the wafers and the walls of the diffusion furnace are treated with phosphorus prior to the diffusion step.

BRIEF DESCRIPTION OF THE DRAWING

The sole FIGURE of the drawing is a diagrammatic representation of the process of carrying out the present invention.

DESCRIPTION OF THE PREFERRED EMBODIMENTS

The present invention relates to the manufacture of large high power transistors of the PNP type. By large is meant transistors wherein the chip size is 10,000 square mills or larger.

Although the invention has as its primary application the manufacture of large high power transistors, it can also be used for smaller transistors and also those for use on lower and higher frequencies.

The general idea of making PNP transistors is well known and the making of such silicon diffusion transistors is shown in the literature, for instance in U.S. Pat. No. 3,791,884 and the references cited therein.

In the conventional making of transistors, the normal operation of the base diffusion step is to drive the base predeposition to the desired junction depth. Heretofore, all of the conventional base diffusion furnaces are clean, i.e. free of dopants and free of contaminates with the sole purpose of driving the base predeposition into the body of the silicon to form the collector base junction. The present invention differs from the prior art primarily in the fact that instead of using a clean furnace for the base diffusion step, the furnace is first treated with a N-type dopant, specifically phosphorus, so that phosphorus is deposited on the walls of the furnace prior to the base diffusion step.

Further, the process of the present invention preferably includes a back side preparation wherein during the base diffusion step the silicon wafers are supported on an inert support which has been charged with an N-type dopant such as phosphorus. The reason for employing a phosphorus doped support capped with an undoped inert material is to prevent contamination during the subsequent boron diffusion step while forming the emitter.

GENERAL PROCESS DESCRIPTION

In the drawing forming a part of this application, a schematic diagram is shown illustrating how the invention is carried out. The diffusion chamber designated 1 is of conventional design and it contains at least one shelf 3 for holding the wafer to be treated. For purposes of illustration, this shelf is shown as horizontal with a single wafer thereon but this is largely diagrammatic and a plurality of shelves would normally be employed so that a large number of wafers can be treated at once. Further, the wafers would ordinarily be held in a vertical position. The diffusion furnace is provided with conventional heating means, not shown, and also two gas inlets 5 and 7. A flask 7 containing highly purified (e.g. having a resistivity of 15 to 18 megohms per $cm^3$) deionized water is connected through valve 9 to line 11. Line 11 has a valve 13 and two sources of oxygen are provided, namely 15 and 17. Valve 19 controls the inflow of oxygen through line 17. Thus, by properly manipulating the valves 9, 13 and 17, one can introduce pure oxygen or oxygen carrying the vapors of deionized water into the chamber 1.

A second vessel 21 is provided which contains a solution of $POCl_3$. This phosphorous oxychloride is an electronic grade having a purity of >99.999%. Nitrogen can be introduced through this vessel to valve 23 where it will bubble through the solution carrying the vapors of $POCl_3$ into the diffusion furnace. This is controlled through valves 25 and 27. A source of $N_2$ carrier gas is provided through line 29 and oxygen bleed gas through line 31.

In carrying out the process of the present invention, the diffusion furnace is charged with phosphorus by opening valves 23, 25 and 27, and this results in a flow of phosphorus vapor from vessel 21 into the furnace, resulting in a deposit upon the furnace walls of elemental phosphorus 33.

Now that the furnace has been charged with phosphorus, the predoped silicon wafers 35 are introduced into the furnace. These, of course, have been suitably masked as is well known by those skilled in the art. The wafers 35 are supported on a layer of 37 of porous silicon dioxide. A suitable material for this purpose is sold under the trade name VAPOX. The VAPOX has been charged with phosphorus.

Now that the wafer is in the chamber, the wafer is first treated on the back side by placing the wafers on a VAPOX support which has been impregnated with phosphorus. The reactor temperature is set at 400° C. to 440° C. and a first layer of about 5,000 Å thick of heavily doped phosphorus-VAPOX is deposited thereon. The second layer consists of about 2500 Å of undoped VAPOX.

ILLUSTRATIVE EXAMPLE OF PROCESS

The following non-limiting example illustrates a preferred mode of carrying out the present invention.

1. Provide P starting material (pure silicon wafer).
2. Initial oxidation of wafer @ 1000° C.: depositing 8000 Å oxide on wafer in clean furnace.
3. Base mask wafer.
4. Base predeposition of phosphorus @ 805° C. on wafer to yield surface resistance of $\rho_\square = 260\,\Omega/\square$.
5. Base diffusion @ 1200° C.
    Steps (i) and (ii) treatments.
    Step (i)—Charging base diffusion furnace with phosphorous as follows:
    $N_2$ carrier @ 1200 cc/min.
    $N_2$ source @ 100 cc/min. (through vessel 21).
    $O_2$ bleed @ 50 cc/min.
    Predope the tube for 15 minutes.
    Step (ii)—Backside wafer preparation, using commercially available VAPOX reactor:
    Reactor temp. set @ 400° C.–440° C.
    First layer—5000 Å. Heavily doped phospho-VAPOX. 2nd layer—2500 Å. Undoped VAPOX.
    After conducting steps i and ii, the wafers are loaded onto a quartz diffusion boat and pushed into the base diffusion furnace pre-charged as above having set the diffusion cycle @ 5 min. $O_{2Dry}$+60 min. stear+15 min. $O_{2Dry}$ achieving the following results:

$-X_{jB} = 4.5\mu$ $\rho_\square = 60\,\Omega/\square$

6. The wafer is then provided with an emitter mask.
7. Wafer subject to CB diode check.
8. Emitter diffusion is then conducted @ 1190° C.
    Step (ii) treatment repeated prior to emitter diffusion.
9. Emitter diffusion cycle:

9 min    + 5 min
    source on    source off surface resistance $\rho_\square = 2.8\,\Omega/\square$ 10. Wafer cooled and removed. Target the following electrical parameters:

| $H_{FE}$ | BVCES | LVCEO | BVEBO |
|---|---|---|---|
| @10ma, 5v | @10μa | @10ma | @10μa |
| 60–100 | >90v | >90v | 5.5v |

In this application, the following abbreviations have been used:

$X_{jB}$ = Base junction depth.
$H_{FE}$ = Current gain (hybrid parameter).
BVCES = Breakdown voltage of Collector to Emitter with Base terminal shorted to Emitter.
LVCEO = Breakdown voltage of Collector to Emitter with Base terminal open.
BVEBO = Breakdown voltage of Emitter to Base with Collector terminal open.

I claim:

1. In the process of making PNP high power transistors wherein a silicon wafer is predoped with a N-type impurity such as phosphorus and the wafer heated in a base diffusion step to diffuse the dopant into the body of the silicon, the improvement comprising carrying out said diffusion step in a heated reaction vessel wherein the walls of the vessel have been first precoated with phosphorus.

2. The process of claim 1 including an initial step of oxidizing the surface of the wafer in a clean furnace prior to base deposition of phosphorus.

3. The process of claim 1 wherein the back side of the wafer is charged with $SiO_2$.

4. The process of claim 1 wherein the wafers are first doped with phospho-, silicon oxide then deposited or capped with pure silicon oxide and then subjected to a diffusion cycle consisting of dry oxygen, steam and dry oxygen successively at a temperature of about 1200° C.

5. The process of claim 1 wherein the wafer is scored into a plurality of chips, each chip being at least 10,000 square mils in size.

* * * * *